(12) United States Patent
Evans

(10) Patent No.: US 7,230,426 B2
(45) Date of Patent: Jun. 12, 2007

(54) SPLIT-SHIELD GRADIENT COIL WITH IMPROVED FRINGE-FIELD

(75) Inventor: Christopher John Evans, Haddenham (GB)

(73) Assignee: General Electric Company, Schenectady, NY (US)

( * ) Notice: Subject to any disclaimer, the term of this patent is extended or adjusted under 35 U.S.C. 154(b) by 873 days.

(21) Appl. No.: 10/604,002

(22) Filed: Jun. 20, 2003

(65) Prior Publication Data

US 2007/0090841 A1   Apr. 26, 2007

(51) Int. Cl.
*G01V 3/00* (2006.01)

(52) U.S. Cl. ....................... 324/318; 324/322

(58) Field of Classification Search ................ 324/318, 324/322, 312, 314, 307, 309, 306, 300
See application file for complete search history.

(56) References Cited

U.S. PATENT DOCUMENTS

| | | | |
|---|---|---|---|
| 4,617,516 A | * | 10/1986 | Schenck ................. 324/318 |
| 4,733,189 A | * | 3/1988 | Punchard et al. ........... 324/318 |
| 6,236,209 B1 | | 5/2001 | Arz |
| 6,265,960 B1 | | 7/2001 | Schauwecker |
| 6,456,074 B1 | | 9/2002 | Minas |
| 6,456,076 B1 | | 9/2002 | Joseph |
| 6,498,947 B2 | | 12/2002 | Boskamp |
| 6,515,479 B1 | | 2/2003 | Arz |

* cited by examiner

*Primary Examiner*—Louis M. Arana
(74) *Attorney, Agent, or Firm*—Peter J. Vogel, Esq.

(57) ABSTRACT

An imaging system 2 is provided comprising a primary gradient coil assembly 52 and a shield coil assembly 42. The shield coil assembly 42 is connected in series to the primary gradient coil assembly 52. The shield coil assembly 42 comprises a first gradient shield coil 82 and a second gradient shield coil 84. The second gradient shield coil 84 is connected in parallel to said first gradient shield coil 82.

21 Claims, 2 Drawing Sheets

SPLIT-SHIELD GRADIENT COIL WITH IMPROVED FRINGE-FIELD

BACKGROUND OF INVENTION

The present invention relates generally to Magnetic Resonance Imaging (MRI) systems, and more particularly, to a method and system for shielding a gradient coil for use in a MRI system.

Magnetic Resonance Imaging (MRI) is a well-known medical procedure for obtaining detailed, one, two and three-dimensional images of patients, using the methodology of nuclear magnetic resonance (NMR). MRI is well suited to the visualization of soft tissues and is primarily used for diagnosing disease pathologies and internal injuries.

Typical MRI systems include a superconducting magnet capable of producing a strong, homogenous magnetic field around a patient or portion of the patient; a radio frequency (RF) transmitter and receiver system, including transmitter and receiver coils, also surrounding or impinging upon a portion of the patient; a gradient coil system also surrounding a portion of the patient; and a computer processing/imaging system, receiving the signals from the receiver coil and processing the signals into interpretable data, such as visual images.

The superconducting magnet is used in conjunction with a gradient coil assembly, which is temporally pulsed to generate a sequence of controlled gradients in the main magnetic field during a MRI data gathering sequence. Inasmuch as the main superconducting magnet produces a homogeneous field, no spatial property varies from location to location within the space bathed by such field; therefore, no spatial information, particularly pertaining to an image, can be extracted therefrom, save by introduction of ancillary means for causing spatial (and temporal) variations in the field strength. This function is fulfilled by the above-mentioned gradient coil assembly; and it is by this means of manipulating the gradient fields that spatial information is typically encoded.

The gradient coil assembly produces undesirable magnetic fields outside the assembly; as well a required fields within the gradient bore. These fringe fields produce eddy currents to be formed within the magnetic structures leading to degradation in image quality.

In order to limit the effects of fringe fields generated by gradient coil assemblies, it is known that shield coils may be used in combination with the primary coils in order to cancel the magnetic field outside of the gradient coil. In this fashion the presence, and thereby the effects, of fringe fields can be reduced. Cylindrical gradient coils, however, with a large radial distance between primary and shield coils require a low current density on the shield coil to provide good cancellation of the magnetic field outside the gradient coil. The "ideal" current density needs to be approximated by physical coil winding in the gradient assembly. These approximations can be inaccurate in the situation where individual windings have a large number of Ampere-Turns relative to the peak Ampere-Turns of the shield coil. Gradient coils in this scenario often result in poor fringe field performance and often have negative effects on image quality.

It would, therefore, be highly desirable to have a gradient coil assembly with improved shield coil performance such that the effects of fringe field degradation may be minimized. It would additionally be highly desirable to have a shield coil assembly with improved winding arrangement for reduction of fringe field degradation.

SUMMARY OF INVENTION

An imaging system is provided comprising a primary gradient coil assembly and a shield coil assembly. The shield coil assembly is connected in series to the primary gradient coil assembly. The shield coil assembly comprises a first gradient shield coil and a second, or more, gradient shield coils. The additional gradient shield coils are connected in parallel to said first gradient shield coil.

The present invention itself, together with attendant advantages, will be best understood by reference to the following detailed description, taken in conjunction with the accompanying FIGURES.

BRIEF DESCRIPTION OF DRAWINGS

For a more complete understanding of this invention reference should now be had to the embodiments illustrated in greater detail in the accompanying FIGURES and described below by way of examples of the invention wherein.

DETAILED DESCRIPTION

While the present invention is described with respect to a method for imaging including a split-shield gradient coil, the present invention may be adapted to imaging within various systems including: those for magnetic resonance spectroscopy systems, and magnetic resonance angiography. The split-shield gradient coil is generally applicable to parallel imaging at high fields.

In the following description, various operating parameters and components are described for one constructed embodiment. These specific parameters and components are included as examples and are not meant to be limiting.

Also in the following description, a MRI system components may include any one of the following: a superconducting magnet, a superconducting magnet support structure, a gradient magnet assembly, or any other MRI system component known in the art.

Figure 1:
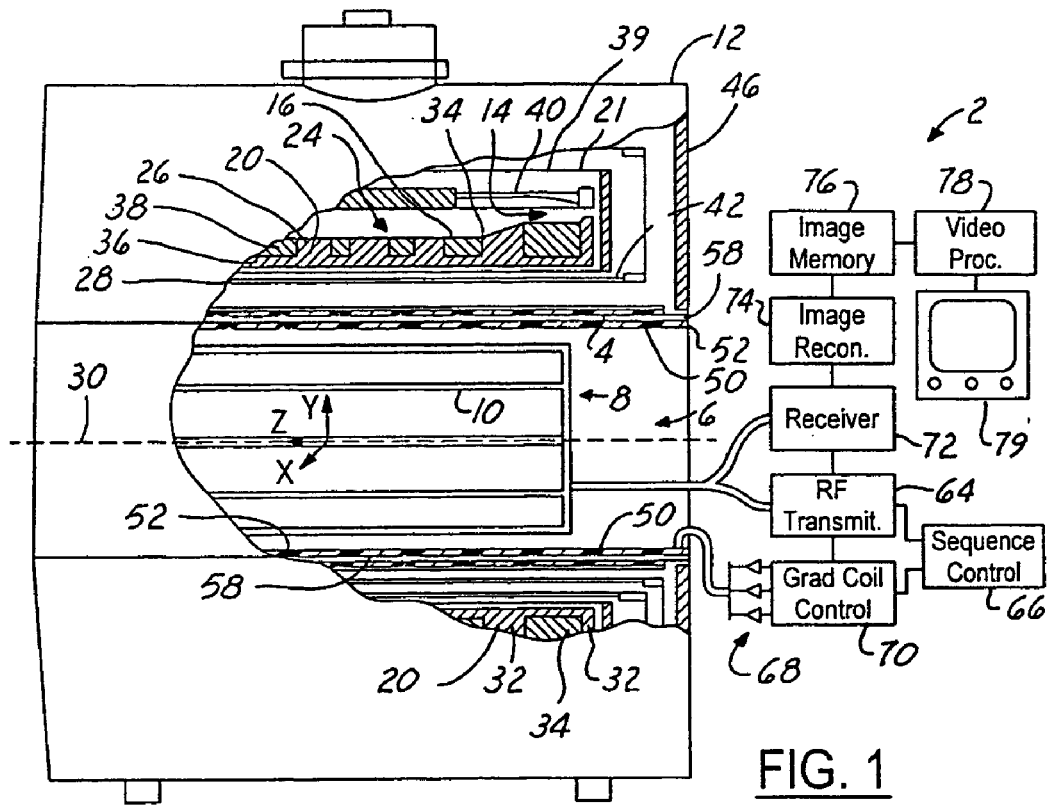
FIG. 1 is a block diagrammatic view of a MRI system in accordance with one embodiment of the present invention.

Referring now to FIG. 1, a block diagrammatic view of a MRI system 2 is shown. The system 2 includes a substantially cylindrical member 4 that defines a scanning bore 6. The scanning bore 6 includes a RF coil assembly 8 mounted therein. The RF coil assembly 8 can include a transmission electron microscopy (TEM) surface resonator 10.

The MRI system 2 further includes a static magnet structure 12 including a superconducting magnet 14 having a plurality of superconducting magnetic field coils 16 which generate a temporally constant magnetic field along a longitudinally z-axis of a scanning bore 6. The superconducting magnet coils 16 are supported by a superconducting magnet coil support structure 20 and received in a cryostat 21.

The superconducting magnet coil support structure 20 provides support for static loads and allows fabrication and accurate placement of magnet coils 16. Only one superconducting magnet 14 and one superconducting magnet coil support structure 20 are shown, however, the disclosed system may have multiple superconducting magnets and superconducting magnet coil support structures.

The superconducting magnet coil support structure 20 is preferably a solid body and includes an exterior side 24, an exterior portion 26, and an interior side 28. The exterior side 24 is the longitudinal side farthest away from the center 30 of the scanning bore 6 that supports the superconducting magnet 14. The exterior side 24 has a plurality of shoulders 32 and a plurality of pockets 34. The plurality of shoulders 32 and the plurality of pockets 34 have dimensions corresponding to dimensions of the superconducting magnet 14. The interior portion 26 is the solid body of the superconducting magnet coil support structure 20. The interior portion 26 has a base 36. The plurality of shoulders 32 are integrally connected to the external side 38 of the base 36. The interior side 28 is preferably cylindrical shaped and is the side closest the center 30 of the scanning bore 6.

The main magnetic field shield coil assembly 40 generates a magnetic field that opposes the field generated by the superconducting magnet coils 16. A shield coil assembly 42 surrounds the helium vessel 39. The shield cold assembly 42 will be described in greater detail. The shield coil assembly 42 is preferably cooled by mechanical refrigeration. The shield coil assembly 42 is preferably encased by a toroidal vacuum vessel 46.

The toroidal vacuum vessel 46 includes the cylindrical member 4 that defines the scanning bore 6 and extends parallel to the longitudinal axis. On a first exterior side 50 of the cylindrical member 4, which is longitudinal side farthest away from the center 30 of the scanning bore 6, is a primary magnetic gradient coil assembly 52. Located on a second exterior side 54 of the primary magnetic gradient coil assembly 52 is a cylindrical dielectric former. A RF (radio frequency) shield 58 is applied to the cylindrical dielectric former.

A RF transmitter 64 is connected to a sequence controller 66 and the primary RF coil 62 (TEM 10). The RF transmitter 64 is preferably digitized. The sequence controller 66 controls a series of current pulse generators 68 via a gradient coil controller 70 that is connected to the primary magnetic gradient coil assembly 52. The RF transmitter 64, in conjunction with the sequence controller 66, generates pulses of radio frequency signals for exciting and manipulating magnetic resonance in selected dipoles of a portion of the subject within the scanning bore 6.

A radio frequency receiver 72 is connected with the primary RF coil 62 for demodulating magnetic resonance signals emanating from an examined portion of the subject. An image reconstruction apparatus 74 reconstructs the received magnetic resonance signals into an electronic image representation that is stored in an image memory 76. An image reconstruction device, such as a video processor 78 converts stored electronic images into an appropriate format for display on a video monitor 79. The scanning bore 6 has a RF coil assembly 8 mounted therein. The RF coil assembly 8 includes a TEM surface resonator 10.

Figure 2:
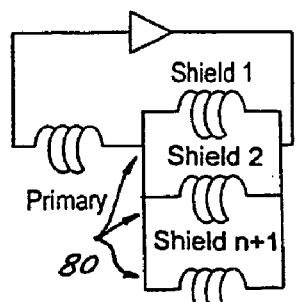
FIG. 2 is a circuit diagram of a perspective view of a coil assembly in accordance with FIG. 1.

Referring now to FIG. 2, which is a circuit diagram of the shield coil assembly 42 in accordance with the present invention. The primary gradient coil assembly 52 is known to generate significant fringe fields during operation. Cylindrical gradient coils 52 with a large radial distance between the primary gradient coil 52 and the shield coil assemblies 42 commonly require a low current density on the shield coil assembly 42 to provide good cancellation of the magnetic field outside the gradient coil (Fringe field). The "ideal" current density needs to be approximated by physical coil windings in the shield coil assembly 42.

The present invention addresses these concerns by making the discrete current-density of the shield coil assembly 42 a better approximation of the theoretical. This is accomplished by reducing the size of the "building block" Ampere-Turn. Specifically, this is accomplished by including a shield coil assembly 42 that comprises a plurality of gradient shield coils 80 (at least two) connected in series to the primary gradient coil 52. By connecting the multiple gradient shield coils 80 in parallel, the current running through each gradient shield coil 80 can be reduced, thereby reducing the discretization effects of converting the ideal current density to a physically realizable one. Each of the gradient shield coils 80 would therefore preferably take half or less of the current that is running through the primary gradient coil 52. Each of the multiple gradient shield coils 80 can have either identical resistances or differing resistances and thereby have either identical currents or differing currents. In this fashion the precise nature of the shielding can be controlled in order to minimize the fringe field.

Figure 3:
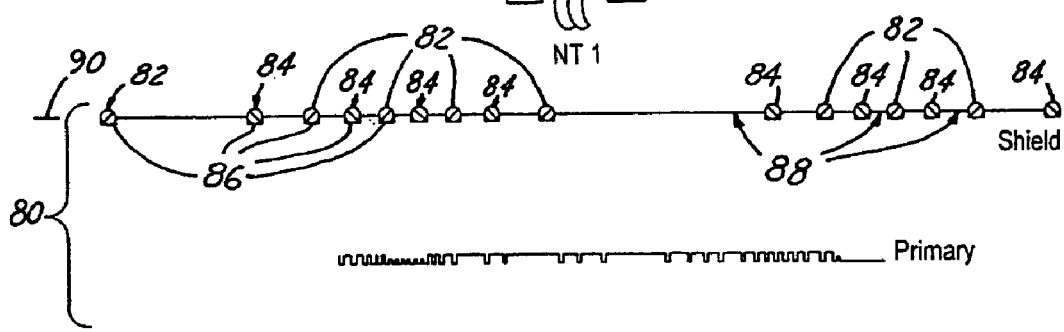
FIG. 3 is a cross-sectional view of the windings of the primary gradient coil and split-shield gradient coil of FIG. 2.

Although a variety of shield coil assemblies 42 utilizing a plurality of gradient shield coils 80 wired in parallel with each other are contemplated, on particular embodiment is illustrated in FIG. 3. FIG. 3 is an illustration of the winding patterns for one embodiment of the primary gradient could 52 and shield coil assembly 42. It should be noted that the shield coil assembly 42 is illustrated with a first gradient shield coil 82 and a second gradient shield coil 84. The present shield coil assembly 42 through the use of dual (or more) gradient coils 82,84 provides more winding turns 86 than normally present in a conventional shield. Although numerous configurations are contemplated, one embodiment contemplates each of the gradient coils 82,84 to have an identical number of winding turns 86. An added advantage of the present invention is that the turns 86 from the second gradient shield coil 84 may be positioned within the winding gaps 88 present between consecutive turns 86 from the first gradient shield coil 82. In effect, all of the winding turns 86 are therefore within a single winding plane 90. In this case, the gain in shielding performance can be considered "free" as the second shield coil 84 uses up space that would otherwise have been wasted between the turns of a conventional shield coil. It should be understood that although only two shield coils 82,84 have been illustrated in FIG. 3 in an asymmetrical winding pattern, alternate embodiments may include additional shield coils that may be spaced within the winding gaps 88 of neighboring shield coils and symmetrical winding patterns.

Figure 6:
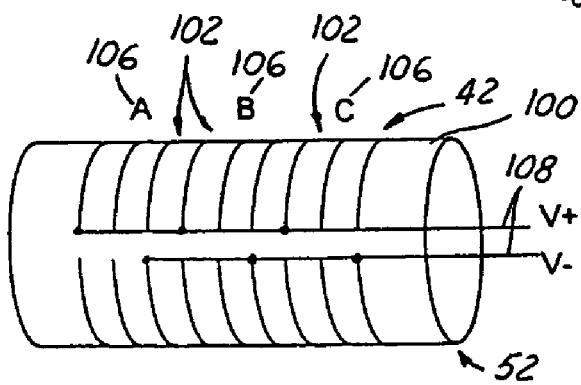
FIG. 6 is a schematic showing an implementation of the split-shield gradient coil, the black dots representing electrical connections, the solid lines the Z winding and the dotted lines the joggles between turns.
Figure 7:
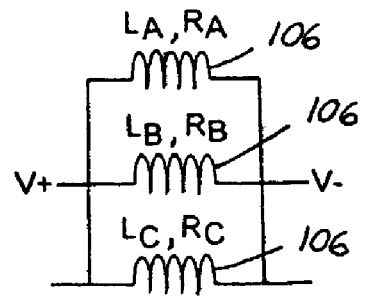
FIG. 7 is a circuit diagram of a the schematic of the split-shield gradient coil in accordance with FIG. 6.

There can be complications when designing gradients with asymmetric geometries in that the number of turns in the primary coil 52 or shield coil 42 does not have to be even. Thus, the simplest way of designing a split-shield gradient coil, by splitting the shield coil 42 in half is not possible as the result would be a non-integer number of turns. As a result, the resistance of the split portions of the shield coil 42 cannot be made equal by halving the coil, which leads to problems with non-equal currents flowing in different sections of the gradient coil. A method and configuration to allow the split-shield approach to be used for asymmetric geometries is shown in FIG. 6, showing a split shield coil 42 applied to an asymmetric Z coil 100. The shield coil 42 is reduced to N sub-coils 102 (3 in the specific case shown), each with an equal number of turns 14. The shield assembly 42 is configured such that the sub-coils 102 are arranged linearly adjacent one another within a single winding plant. The electrical connections of the coil are performed by jointing the sub-coils 102 to two voltage rails (V+ and V−) 108 which run axially along the length of the gradient coil 52. The number of sub-circuits 106 in the shield coil assembly 42 can be adjusted such that the resistance in each sub-circuit 106 is approximately equal (see FIG. 7). As the density of turns 104 is increased, the errors in resistance due to different lengths in the axial run diminish.

Figure 4:
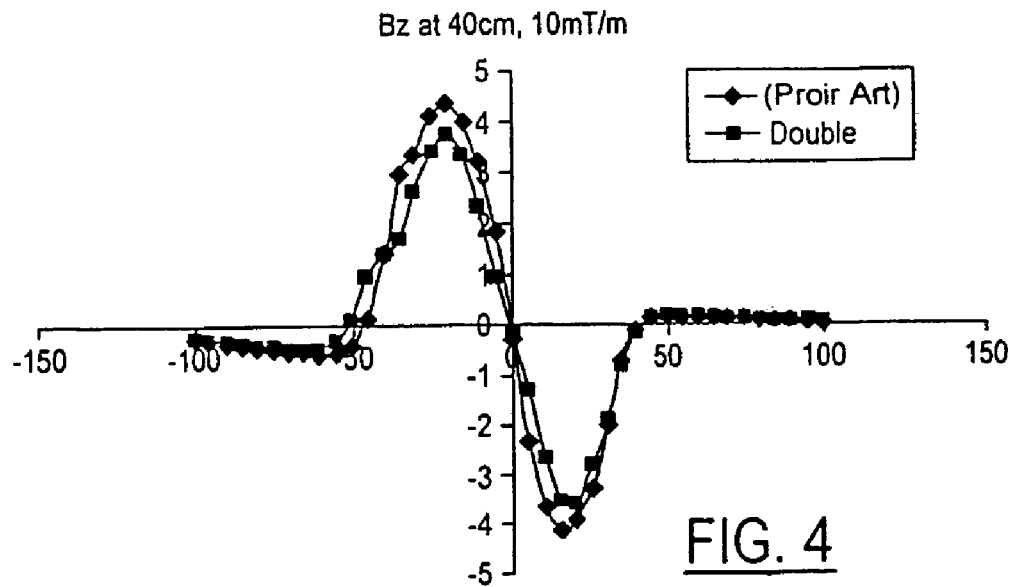
FIG. 4 is a graph of fringe field strength in the z-direction as reduced by the split-shield gradient coil illustrated in FIG. 2.
Figure 5:
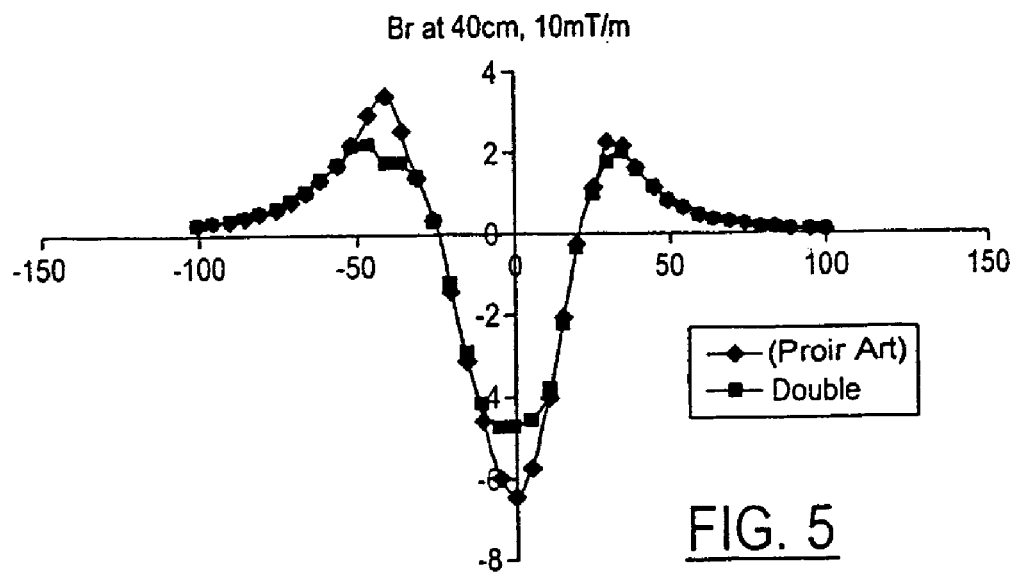
FIG. 5 is a graph of the fringe field strength in the r-direction as reduced by the split-shield gradient coil illustrated in FIG. 2.

The use of the shield coil assembly 42 including a plurality of individual shield coils 80 wired in parallel can have considerable impact on reduction of fringe fields (see FIG. 2). In a particular embodiment utilizing two shield coils 80 combining to include 16 winding turns, as opposed to a conventional 9 turn single coil shield, was determined to significantly impact both axial fringe fields z-direction (FIG. 4) as well as radial fringe fields r-direction (x-direction) (FIG. 5). The embodiment showed an approximately 27% decrease in the peak radial field (from 6.4 mT to 4.7 mT) and a 20% drop in the peak axial field (4.4 mT to 3.5 mT). It should be understood, however, that these results are intended to be illustrative and not limiting on the present invention.

The above-described apparatus, to one skilled in the art, is capable of being adapted for various purposes and is not limited to the following systems: MRI systems, magnetic resonance spectroscopy systems, and other applications where field instability is an issue in the design of system components. The above-described invention may also be varied without deviating from the spirit and scope of the invention as contemplated by the following claims.

The invention claimed is:

1. An imaging system comprising:
A primary gradient coil assembly; and
A shield coil assembly connected in series to said primary gradient coil assembly, said shield coil assembly comprising:
a first gradient shield coil;
a second gradient shield coil connected in parallel to said first gradient shield coil;
a pair of voltage rails in communication with said first gradient shield coil and said second gradient shield coil;
a first subcircuit in communication with said first gradient shield coil; and
a second subcircuit in communication with said second gradient shield coil, said first subcircuit and said second subcircuit independently adjustable such that the currents through said first gradient shield coil and said second gradient shield coil may be independently adjusted.

2. An imaging system as in claim 1 further comprising at least one additional gradient shield coil connected in parallel to said first gradient shield coil and said second gradient shield coil.

3. An imaging system as in claim 1 wherein said first subcircuit and said second subcircuit are adjusted such that said first gradient shield coil has a resistance equal to said second gradient shield coil.

4. An imaging system as in claim 1 wherein:
said first gradient shield coil comprises a plurality of first shield winding turns; and
said second gradient shield coil comprises a plurality of second shield winding turns, said plurality of second shield winding turns having a non-identical number of turns as said plurality of first shield winding turns.

5. An imaging system as in claim 1 wherein:
said first gradient shield coil comprises a plurality of first shield winding turns and a plurality of winding gaps, each of said plurality of winding gaps formed between consecutive turns of said plurality of first shield winding turns; and
said second gradient shield coil comprises a plurality of second shield winding turns, each of said plurality of second shield winding turns positioned within on of said winding gaps.

6. An imaging system as in claim 5 wherein said plurality of first shield winding turns and said plurality of second shield winding turns are positioned within a single winding plane.

7. An imaging system as in claim 1 wherein said shield coil assembly comprises a plurality of winding turns formed in an asymmetrical pattern.

8. An imaging system as in claim 1 wherein:
said first gradient shield coil comprises a plurality of first shield winding turns forming a first sub-coil;
said second gradient shield coil comprises a plurality of second shield winding turns forming a second sub-coil, said second sub-coil positioned linearly adjacent to said first sub-coil and position within a single winding plane.

9. An imaging system comprising:
A primary gradient coil assembly; and
A shield coil assembly surrounding said primary gradient coil assembly, said shield coil assembly comprising;
a first gradient shield coil; and
a second gradient shield coil connected in parallel to said first gradient shield coil;
a pair of voltage rails in communication with said first gradient shield coil and said second gradient shield coil;
a first subcircuit in communication with said first gradient shield coil; and
a second subcircuit in communication with said second gradient shield coil, said first subcircuit and said second subcircuit independently adjustable such that the currents through said first gradient shield coil and said second gradient shield coil may be independently adjusted;
wherein said shield coil assembly comprises a plurality of winding turns formed in an asymmetrical pattern.

10. An imaging system as in claim 9 further comprising at least one additional gradient shield coil connected in parallel to said first gradient shield coil and said second gradient shield coil.

11. An imaging system as in claim 9 wherein said first subcircuit and said second subcircuit are adjusted such that said first gradient shield coil has a resistance equal to said second gradient shield coil.

12. An imaging system as in claim 9 wherein:
said first gradient shield coil comprises a plurality of first shield winding turns; and said second gradient shield coil comprises a plurality of second shield winding turns, said plurality of second shield winding turns having a non-identical number of turns as said plurality of first shield winding turns.

13. An imaging system as in claim 9 wherein:
said first gradient shield coil comprises a plurality of first shield winding turns and a plurality of winding gaps, each of said plurality of winding gaps formed between consecutive turns of said plurality of first shield winding turns; and
said second gradient shield coil comprises a plurality of second shield winding turns, each of said plurality of second shield winding turns positioned within on of said winding gaps.

14. An imaging system as in claim 9 wherein:
said first gradient shield coil comprises a plurality of first shield winding turns forming a first sub-coil;
said second gradient shield coil comprises a plurality of second shield winding turns forming a second sub-coil, said second sub-coil positioned linearly adjacent to said first sub-coil and position within a single winding plane.

15. An imaging system as in claim 13 wherein said plurality of first shield winding turns and said plurality of second shield winding turns are positioned within a single winding plane.

16. An imaging system as in claim 9 wherein said shield coil assembly comprises a plurality of winding turns formed in an asymmetrical pattern.

17. A method of reducing the fringe field generated by a primary gradient coil assembly comprising:
running a first current through a first gradient shield coil connected in parallel to the primary gradient coil assembly;
running a second current through a second gradient shield coil connected in series to the primary gradient coil assembly, said second gradient shield coil connected in parallel to said first gradient shield coil;
adjusting said first current and said second current independently to minimize the fringe field.

18. A method as described in claim 17, wherein said first current is equal to said second current.

19. A method as described in claim 17, further comprising:
adjusting said first current and said second current independently to minimize the fringe field.

20. A method as described in claim 17, wherein said first current and said second current are passed through an equal number of winding turns.

21. A method as described in claim 17, wherein said first gradient shield coil and said second gradient shield coil share a single winding plane.

* * * * *